(12) United States Patent
Inoue et al.

(10) Patent No.: US 11,411,541 B2
(45) Date of Patent: Aug. 9, 2022

(54) HIGH FREQUENCY POWER SUPPLY DEVICE AND HIGH FREQUENCY POWER SUPPLY METHOD

(71) Applicant: TOKYO ELECTRON LIMITED, Tokyo (JP)

(72) Inventors: Mitsuya Inoue, Yamanashi (JP); Mitsutoshi Ashida, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 149 days.

(21) Appl. No.: 16/821,694

(22) Filed: Mar. 17, 2020

(65) Prior Publication Data

US 2020/0313628 A1 Oct. 1, 2020

(30) Foreign Application Priority Data

Mar. 27, 2019 (JP) .............................. JP2019-061350

(51) Int. Cl.
*H03F 3/04* (2006.01)
*H03F 1/30* (2006.01)
(Continued)

(52) U.S. Cl.
CPC .......... *H03F 1/30* (2013.01); *H01J 37/32009* (2013.01); *H03F 3/189* (2013.01);
(Continued)

(58) Field of Classification Search
CPC ...... H03F 1/30; H03F 3/189; H03F 2200/462; H03F 2200/471; H03F 2200/447;
(Continued)

(56) References Cited

U.S. PATENT DOCUMENTS 7,292,047 B2 * 11/2007 Tanaka ............. H01J 37/32082
324/600
7,489,206 B2 * 2/2009 Kotani ..................... H03H 7/40
331/74
(Continued)

FOREIGN PATENT DOCUMENTS

JP H07-191764 A 7/1995
JP 2017-169100 A 9/2017
(Continued)

*Primary Examiner* — Khanh V Nguyen
(74) *Attorney, Agent, or Firm* — Fenwick & West LLP

(57) ABSTRACT

A device includes an amplifier for amplifying and supplying a high frequency power supplied to a load, a parameter detector for detecting a parameter of a current, a voltage, or a power from the amplifier to the load, a current supply unit for supplying a driving current for the amplifier, and an output unit for outputting a command signal for changing an amplification degree of the amplifier based on the detected parameter such that the parameter becomes a target value. The device further includes a first abnormality detector for detecting an abnormality by monitoring the command signal, and/or a current detector for detecting the driving current, a current data storage unit storing an upper and a lower limit value of the driving current, and a second abnormality detector for detecting the abnormality based on at least one of the upper limit value or the lower limit value.

18 Claims, 6 Drawing Sheets

(51) Int. Cl.
*H03F 3/189* (2006.01)
*H01J 37/32* (2006.01)

(52) U.S. Cl.
CPC ............... *H01J 2237/24564* (2013.01); *H01J 2237/24585* (2013.01); *H03F 2200/447* (2013.01); *H03F 2200/462* (2013.01); *H03F 2200/465* (2013.01); *H03F 2200/468* (2013.01); *H03F 2200/471* (2013.01)

(58) Field of Classification Search
CPC ......... H03F 2200/468; H03F 2200/465; H03F 3/20; H01J 37/32009; H01J 2237/24585; H01J 2237/24564; H01J 37/32174; G01R 31/2822; G01R 19/0092
USPC .................................. 330/136, 270, 289, 290
See application file for complete search history.

(56) References Cited

U.S. PATENT DOCUMENTS

| | | | | |
|---|---|---|---|---|
| 8,203,859 B2* | 6/2012 | Omae | ............... | H01J 37/32174 |
| | | | | 363/165 |
| 8,742,844 B2* | 6/2014 | Kousai | ................ | H03G 3/3042 |
| | | | | 330/136 |
| 2012/0157020 A1* | 6/2012 | Sasaki | ................. | H03G 3/3042 |
| | | | | 455/127.1 |

FOREIGN PATENT DOCUMENTS

| | | |
|---|---|---|
| JP | 2018-143368 A | 9/2018 |
| KR | 10-2015-0096427 A | 8/2015 |

* cited by examiner

HIGH FREQUENCY POWER SUPPLY DEVICE AND HIGH FREQUENCY POWER SUPPLY METHOD

CROSS-REFERENCE TO RELATED APPLICATION

This application claims priority to Japanese Patent Application No. 2019-061350, filed on Mar. 27, 2019, the entire contents of which are incorporated herein by reference.

TECHNICAL FIELD

The present disclosure relates to a high frequency power supply device and a high frequency power supply method.

BACKGROUND

In a semiconductor device manufacturing process, for example, a plasma processing apparatus for performing film formation or etching on a substrate using plasma has been proposed. The plasma processing apparatus includes, e.g., a high frequency power supply device for supplying a high frequency power amplified by an amplifier to a plasma electrode. A processing gas is supplied into, e.g., a processing chamber and the high frequency power is supplied to the plasma electrode to generate a high frequency electric field in the processing chamber. Then, the plasma of the processing gas is generated and plasma treatment is performed on the substrate using the generated plasma.

For example, Japanese Patent Application Publication No. 2018-143368 discloses a high frequency power supply device including a plurality of vacuum tubes connected in parallel. The high frequency power supply device includes a voltage calculation unit for calculating a voltage change rate of each vacuum tube with respect to an average value of cathode voltages of the parallel-connected vacuum tubes and a current calculation unit for calculating a current change rate of each vacuum tube with respect to an average value of currents of the parallel-connected vacuum tubes. Then, it is determined whether or not each vacuum tube has reached the end of its lifespan by comparing the voltage change rate of each vacuum tube with a voltage lifespan setting value and comparing the current change rate of each vacuum tube with a current lifespan setting value.

The present disclosure provides a technique for detecting deterioration of an amplifier or abnormality (defect) of a detector in supplying a high frequency power.

SUMMARY

In accordance with an aspect of the present disclosure, there is provided a high frequency power supply device including: an amplifier configured to amplify a high frequency supplied from an oscillator and supply a high frequency power therefrom to a load; a parameter detector configured to detect a parameter of a current, a voltage, or a power supplied from the amplifier to the load; a current supply unit configured to supply a driving current for driving the amplifier; and a command signal output unit configured to output a command signal for changing an amplification degree of the amplifier based on the detected parameter such that the parameter becomes a target value. The high frequency power supply device further includes a first abnormality detector configured to detect an abnormality by monitoring the command signal, and/or the high frequency power supply device further includes a current detector configured to detect the driving current, a current data storage unit configured to store an upper limit value and a lower limit value of the driving current, and a second abnormality detector configured to detect the abnormality based on at least one of the upper limit value or the lower limit value of the driving current.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
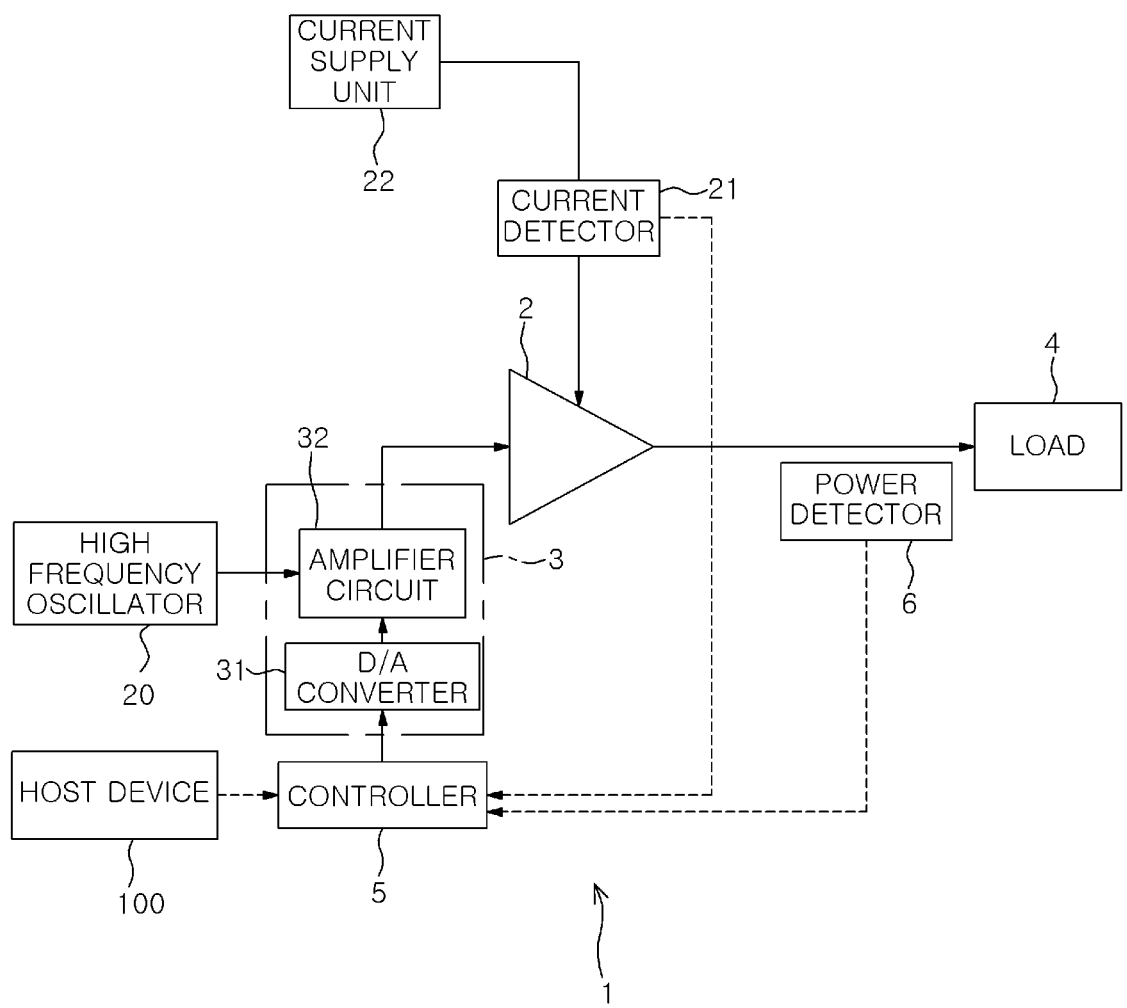
FIG. 1 is a block diagram showing a high frequency power supply device according to an embodiment of the present disclosure.

Hereinafter, a high frequency power supply device according to an embodiment of the present disclosure will be described. As shown in FIG. 1, a high frequency power supply device 1 is configured to amplify a high frequency power using an amplifier 2 and to supply the amplified high frequency power to a load 4. The amplifier 2 serving as a rear-stage amplifier is formed by combining a plurality of transistors. A reference numeral '22' in FIG. 1 denotes a current supply unit for supplying a DC current as a driving current to the amplifier 2. In this example, the high frequency power supply device 1 measures a high frequency power inputted to the load 4, and the high frequency power supply device 1 increases or decreases an amplification factor of the amplifier 2 based on the measured high frequency power to adjust the high frequency power to a set target value.

As shown in FIG. 1, the high frequency power supply device 1 includes a power detector 6 for measuring a high frequency power. The power detector 6 is an example of a parameter detector. The power detector 6 measures a voltage at a high frequency and calculates a measured power value based on an amplitude of the voltage, for example.

Further, the high frequency power supply device 1 includes a controller (control device) 5 that is a command signal output unit. As will be described in detail later, the controller 5 outputs a digital signal that is a command signal for changing an amplification degree of a high frequency signal in an amplifying device 3 based on a difference between a target power value set by a host device 100 and a power value measured by the power detector 6.

The high frequency power supply device 1 further includes a high frequency oscillator 20 and the amplifying device 3 for increasing and decreasing a high frequency output supplied from the high frequency oscillator 20 to the amplifier 2. The amplifying device 3 serving as a front-stage amplifier includes a D/A converter 31, an amplifier circuit 32 including transistors and the like. In the amplifying device 3, a command value (command signal) that is a digital signal is converted to an analog voltage by the D/A converter 31. The amplifier circuit 32 amplifies a high frequency signal with an amplification degree corresponding to the analog voltage.

In the high frequency power supply device 1, the amplifier 2 may gradually deteriorate during the supply of the high frequency power and eventually malfunction. Conventionally, for example, a measured power value is monitored and an alarm is issued or the operation of the device is stopped when the measured power value becomes smaller than a threshold. However, the conventional control is performed based on whether or not the high frequency power supplied to the load 4 has decreased during the operation of the device. Therefore, the power supplied to the load 4 may become insufficient, which leads to the processing failure on the load 4 side. If the load 4 is a component of an apparatus for processing a semiconductor wafer W, as will be described later, the processing of the semiconductor wafer W becomes poor and the yield decreases. Further, if a component for replacement or a replacement work is prepared at the time when the amplifier 2 cannot be used due to malfunction, a long period of time is required to recover the high frequency power supply device 1 and the processing of the semiconductor wafer W is delayed during that period.

Therefore, in the high frequency power supply device 1 according to an embodiment of the present disclosure, the controller 5 monitors an adjusting amount to be described later and a current value of the driving current supplied from the current supply unit 22 to the amplifier 2 so that the deterioration of the amplifier 2 can be detected before the power outputted from the amplifier 2 decreases significantly.

Figure 2:
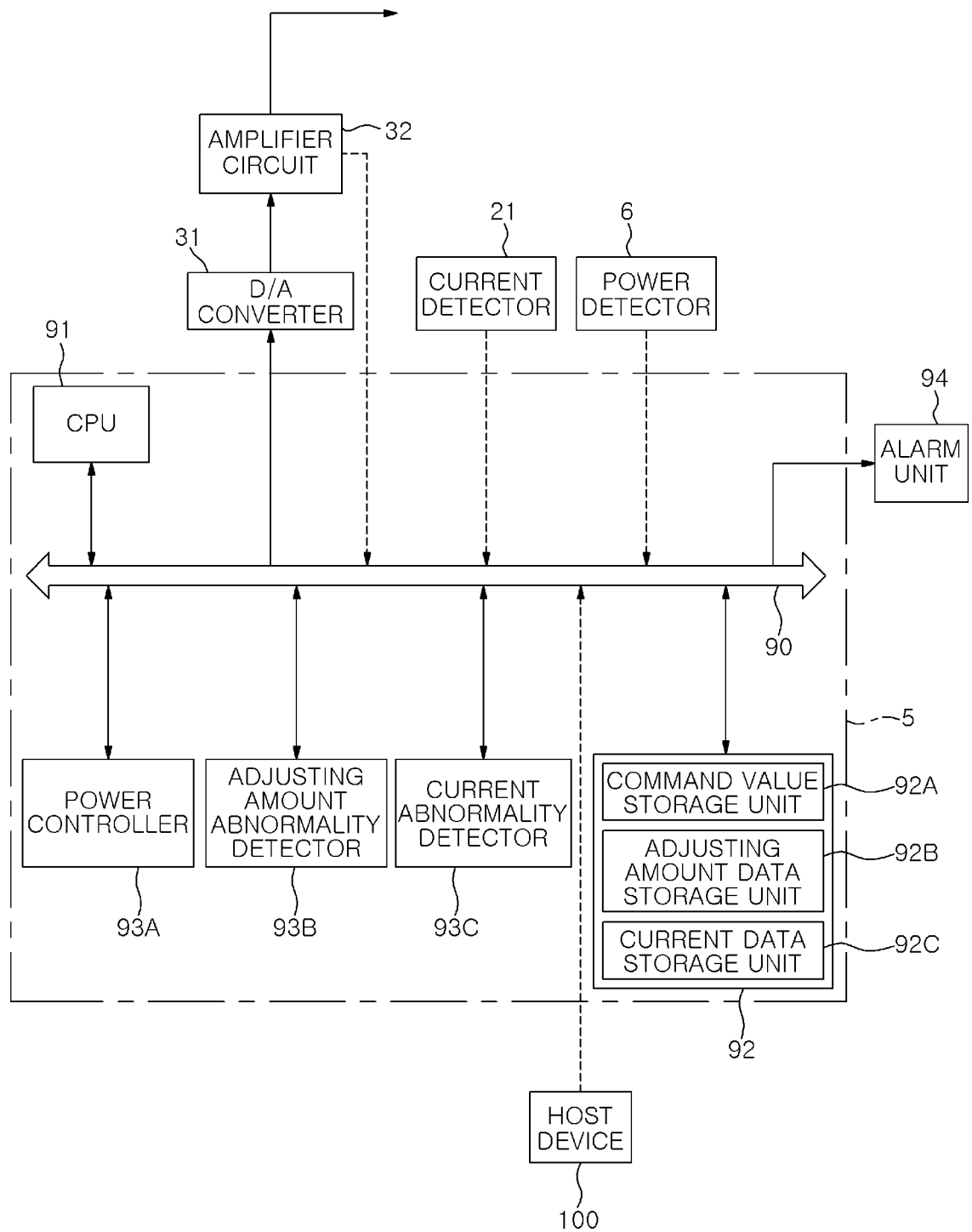
FIG. 2 is a block diagram showing a controller of the high frequency power supply device.

FIG. 2 is a block diagram showing the controller 5. The controller 5 includes a CPU 91, a power controller 93A, an adjusting amount abnormality detector 93B serving as a first abnormality detector, and a current abnormality detector 93C serving as a second abnormality detector. A reference numeral '90' in FIG. 2 denotes a bus. The controller 5 further includes a memory 92 including a command value storage unit 92A, an adjusting amount data storage unit 92B, and a current data storage unit 92C. An alarm unit 94 is connected to the controller 5. A target power value is inputted from the host device 100 to the controller 5, and a measured power value is inputted from the power detector 6 to the controller 5. In addition, a current value is inputted from a current detector 21, provided to detect a current value of a DC current for driving the amplifier 2 shown in FIG. 1, to the controller 5.

The power controller 93A outputs, as the adjusting amount, the digital signal based on the difference between the target power value inputted from the host device 100 and the measured power value inputted from the power detector 6 as described above. The digital signal is outputted such that the amplification factor in the amplifying device 3 increases (the adjusting amount increases) as the difference increases. As described above, the digital signal is outputted from the controller 5 and the amplification factor is changed by the change in the digital signal. However, for the sake of convenience in description, in graphs to be described later, it is assumed that the change in the digital signal is the change in the parameter of the analog signal value, and the parameter of the analog signal value will be described as the adjusting amount.

Figure 3:
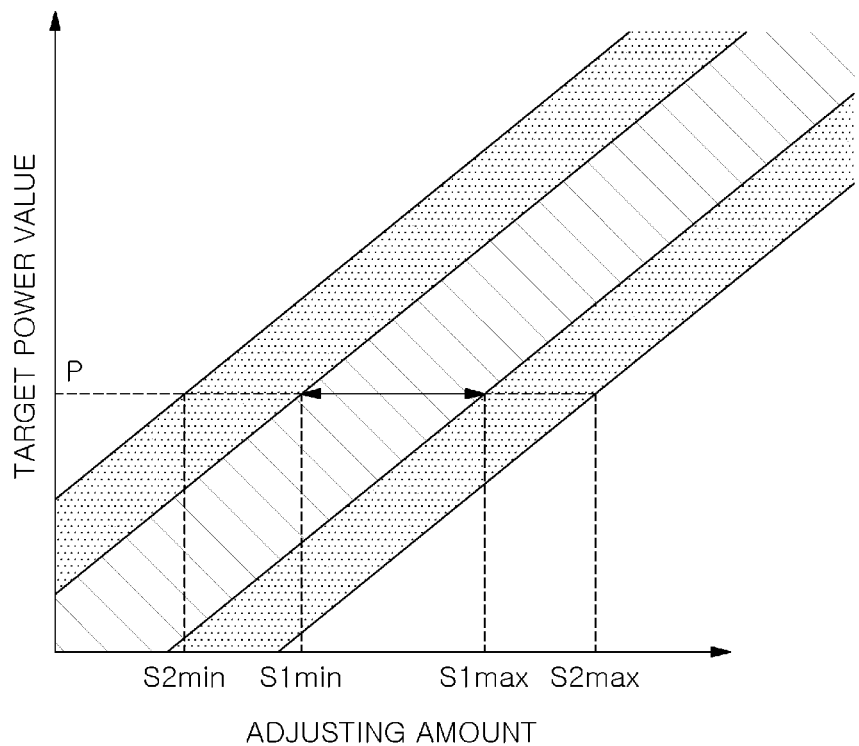
FIG. 3 is a graph showing an upper limit value and a lower limit value of an adjusting amount corresponding to a target power value.

The adjusting amount abnormality detector 93B of the present embodiment determines abnormality of the amplifier 2 based on the adjusting amount and an upper limit threshold and a lower limit threshold of the adjusting amount stored in the adjusting amount data storage unit 92B. FIG. 3 is a graph schematically showing a relational expression stored in the adjusting amount data storage unit 92B. A hatched region in FIG. 3 indicates values between a first upper limit threshold and a first lower limit threshold of the adjusting amount and dotted regions outside the hatched region indicate values between a second upper limit threshold and a second lower limit threshold of the adjusting amount.

A first lower limit threshold $S1_{min}$ of the adjusting amount is set based on a lower limit value of an adjusting amount that is obtained by, for example, controlling a high frequency power with the power controller 93A when the high frequency power is outputted using a newly provided amplifier 2 while setting a target power value to a value of 'P.' A second lower limit threshold $S2_{min}$ of the adjusting amount, which is smaller than the first lower limit threshold $S1_{min}$, is set based on a value of the adjusting amount at which it can be determined with certainty that the high frequency power supply device is malfunctioning.

A first upper limit threshold $S1_{max}$ of the adjusting amount is set based on an upper limit value of an adjusting amount that is obtained by, for example, controlling a high frequency power with the power controller 93A when a target power value is set to the value of 'P' and the high frequency power is outputted using an amplifier 2 that is able to output a sufficient high frequency voltage but has deteriorated through use. A second upper limit threshold $S2_{max}$ of the adjusting amount, which is greater than the first upper limit threshold $S1_{max}$, is set based on a value of the adjusting amount at which it can be determined that the amplifier 2 is malfunctioning.

In the high frequency power supply device 1, when the target power value P increases, the amplification degree needs to be increased and, thus, the adjusting amount also increases. Therefore, the upper limit threshold and the lower limit threshold of the adjusting amount are set to become greater as the target power value P inputted from the host device 100 becomes greater.

The adjusting amount abnormality detector 93B detects whether or not the abnormality has occurred by comparing the adjusting amount outputted from the amplifier circuit 32 with the first upper limit threshold $S1_{max}$, the first lower limit threshold $S1_{min}$, the second upper limit threshold $S2_{max}$, and the second lower limit threshold $S2_{min}$ of the adjusting amount set based on the target power value P.

When the adjusting amount is greater than the first upper limit threshold $S1_{max}$ or smaller than the first lower limit threshold $S1_{min}$, the alarm unit 94 issues an alarm to notify the deterioration of the amplifier 2. When the adjusting amount is greater than the second upper limit threshold $S2_{max}$ or smaller than the second lower limit threshold $S2_{min}$, the operation of the high frequency power supply device is stopped for maintenance such as the replacement of the amplifier 2.

Figure 4:
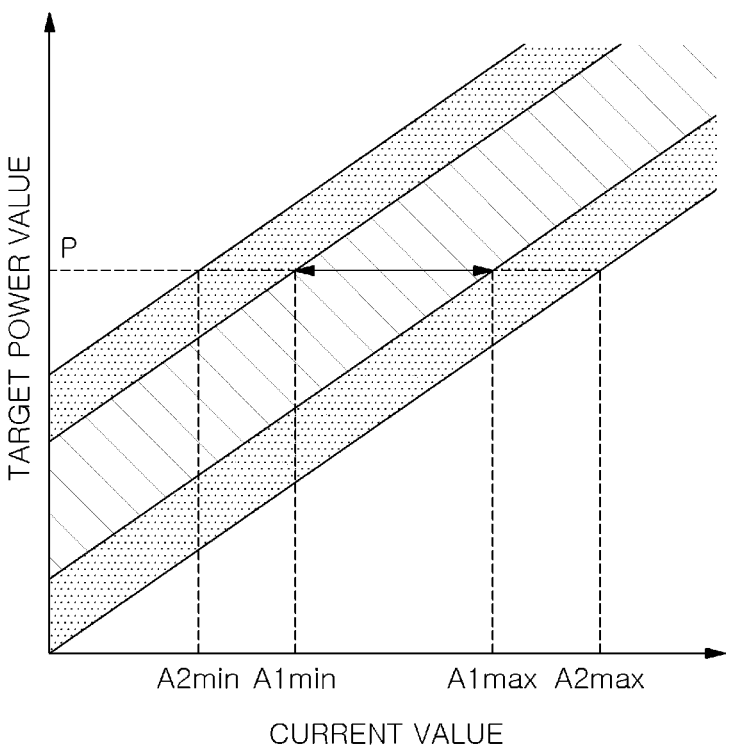
FIG. 4 is a graph showing an upper limit value and a lower limit value of a current value corresponding to a target power value.

The current abnormality detector 93C of the present embodiment determines whether or not the amplifier 2 is abnormal by comparing the current value of the driving current for driving the amplifier 2 with an upper limit threshold and a lower limit threshold of the current value stored in the current data storage unit 92C. FIG. 4 is a graph schematically showing a relational expression stored in the current data storage unit 92C. A hatched region in FIG. 4 indicates values between a first upper limit threshold and a first lower limit threshold of the current value, and dotted regions outside the hatched region indicate values between a second upper limit threshold and a second lower limit threshold of the current value.

A first lower limit threshold $A1_{min}$ of the current value is set based on a lower limit value of a current value that is obtained by, for example, controlling a high frequency power with the power controller 93A when the high frequency power is outputted using a newly provided amplifier 2 while setting a target power value to a value of 'P.' A second lower limit threshold $A2_{min}$ of the current value, which is smaller than the first lower limit threshold $A1_{min}$, is set based on a value of the current value at which it can be determined with certainty that the high frequency power supply device is malfunctioning.

A first upper limit threshold $A1_{max}$ of the current value is set based on an upper limit value of a current value that is obtained by, for example, controlling a high frequency power with the power controller 93A when a target power value is set to the value of 'P' and the high frequency power is outputted using an amplifier 2 that is able to output a sufficient high frequency voltage but has deteriorated through use. A second upper limit threshold $A2_{max}$ of the current value, which is greater than the first upper limit threshold $A1_{max}$, is set based on a value of the current value at which it can be determined that the amplifier 2 currently experiences malfunctions.

In the high frequency power supply device 1, when the target power value P increases, the amplification degree needs to be increased and, thus, the current value also increases. Therefore, the upper limit threshold and the lower limit threshold of the current value are set to become greater as the target power value P inputted from the host device 100 becomes greater.

The current abnormality detector 93C detects whether or not the abnormality has occurred by comparing the current value of the driving current supplied to the amplifier 2 with the first upper limit threshold $A1_{max}$, the first lower limit threshold $A1_{min}$, the second upper limit threshold $A2_{max}$, and the second lower limit threshold $A2_{min}$ of the current value set based on the target power value P.

When the current value is greater than the first upper limit threshold $A1_{max}$ or smaller than the first lower limit threshold $A1_{min}$, the alarm unit 94 issues an alarm to notify the deterioration of the amplifier 2. When the current value is greater than the second upper limit threshold $A2_{max}$ or smaller than the second lower limit threshold $A2_{min}$, the operation of the high frequency power supply device 1 is stopped for the maintenance such as the replacement of the amplifier 2.

Hereinafter, the operation of the high frequency power supply device 1 according to the embodiment of the present disclosure will be described. When the high frequency power supply device 1 is powered on, the target power value P is inputted from the host device 100 to the controller 5. At this time, the high frequency power is not supplied to the load 4 and, thus, the controller 5 outputs the adjusting amount to the amplifying device 3 based on the difference between the target power value P and the measured power value obtained by the power detector 6. Then, the amplifying device 3 amplifies the high frequency with an amplification degree according to the adjusting amount and outputs the amplified high frequency to the amplifier 2. The high frequency is further amplified by the amplifier 2 and the further amplified high frequency is outputted to the load 4.

The adjusting amount abruptly increases and stabilizes to a constant value as the difference between the target power value P and the measured power value decreases. For example, after a predetermined period of time elapses from the start of outputting the command value from the controller 5 to the amplifying device 3, the controller 5 obtains the adjusting amount at predetermined time intervals and calculates an average value of the obtained adjusting amounts. In the following description, the average value thus obtained is used as the adjusting amount used for comparison with the thresholds.

The adjusting amount abnormality detector 93B compares the adjusting amount (the average value) with the upper limit threshold and the lower limit threshold of the preset adjusting amount set based on the target power value P. Further, the current value of the driving current of the amplifier 2 detected by the current detector 21 is inputted to the controller 5. The current abnormality detector 93C compares the current value with the upper limit threshold and the lower limit threshold of the set current value set based on the target power value P.

When the amplifier 2 is normally functioning without significant deterioration, the adjusting amount is in a range between the first upper limit threshold $S1_{max}$ and the first lower limit threshold $S1_{min}$ of the preset adjusting amount corresponding to the target power value P shown in FIG. 3. Further, the current value is in a range between the first upper limit threshold $A1_{max}$ and the first lower limit threshold $A1_{max}$ of the preset current value corresponding to the target power value P shown in FIG. 4. Therefore, the supply of the high frequency power to the load 4 is continued without causing the alarm unit 94 to issue an alarm through the adjusting amount abnormality detector 93B and the current abnormality detector 93C.

However, the amplifier 2 gradually deteriorates while the high frequency power supply device 1 is being used. Therefore, the output of the high frequency power tends to be decreased with respect to the adjusting amount inputted to the amplifier 2 (that is, the high frequency power is not outputted in proportion to the adjusting amount). Accordingly, the difference between the target power value P and the measured power value increases, and the large value of the adjusting amount is outputted in order to increase the amplification degree in the amplifying device 3. Further, due to the deterioration of the amplifier 2, the resistance of the amplifier 2 increases and, thus, the current value of the driving current of the amplifier 2 increases.

If the degree of deterioration of the amplifier 2 further increases, the adjusting amount inputted to the amplifier 2 exceeds, e.g., the first upper limit threshold $S1_{max}$ when the adjusting amount abnormality detector 93 compares the adjusting amount inputted to the amplifier 2 with the upper limit threshold and the lower limit threshold of the preset adjusting amount set based on the target power value P. Accordingly, the adjusting amount abnormality detector 93 causes the alarm unit 94 to issue an alarm to notify the deterioration of the amplifier 2.

Further, for example, even when the adjusting amount inputted to the amplifier 2 is between the first upper limit threshold $S1_{max}$ and the first lower limit threshold $S1_{min}$ of the adjusting amount, if the current value of the driving current of the amplifier 2 exceeds the first upper limit threshold $A1_{max}$ of the preset current value set based on the target power value P, the alarm unit 94 issues an alarm to notify the deterioration of the amplifier 2.

As described above, the alarm unit 94 issues an alarm when the adjusting amount inputted to the amplifier 2 exceeds a predetermined upper limit threshold or when the current value of the driving current of the amplifier 2 exceeds a predetermined upper limit threshold, so that a user can recognize the deterioration of the amplifier 2. At this time, an adjusting amount greater than the upper limit threshold $S1_{max}$ of the preset adjusting amount set based on the target power value P is inputted to the amplifier 2. Therefore, the amplifier 2 receives the adjusting amount largely increased due to the deterioration. Therefore, although the amplifier 2 is deteriorated, a large amount of the high frequency power can be outputted therefrom. Thus, a sufficient amount of the high frequency power can be supplied to the load 4. Accordingly, the user can recognize the deterioration of the amplifier 2 in a state where the sufficient amount of the high frequency power is supplied to the load 4, so that an alternative device to the high frequency power supply device or a plan for stopping the process can be prepared.

Meanwhile, when the driving of the high frequency power supply device 1 is continued even after an alarm is issued by the alarm unit 94, the adjusting amount corresponding to the target power value P further increases due to the progress of the deterioration of the amplifier 2. Then, the adjusting amount eventually exceeds the second upper limit threshold $S2_{max}$. At this time, the adjusting amount abnormality detector 93B causes the alarm unit 94 to issue an alarm and the operation of the high frequency power supply device 1 is stopped.

Further, as the deterioration of the amplifier 2 progresses, the current value corresponding to the target power value P further increases. Therefore, the current value eventually exceeds the second upper limit threshold $A2_{max}$. Accordingly, the current abnormality detector 93C causes the alarm unit 94 to issue an alarm and the operation of the high frequency power supply device 1 is stopped.

For example, when the power detector 6 is defective, the measured power value may increase. In this case, the difference between the target power value P and the measured power value decreases and the command value decreases, so that the adjusting amount decreases.

In the present embodiment, when the adjusting amount is monitored, whether or not the adjusting amount is greater than or equal to the lower limit threshold of the amplification degree corresponding to the target power value P is also monitored. Therefore, in the case where the amplification degree is excessively small, if the adjusting amount becomes smaller than the first lower limit threshold $S1_{min}$, the alarm unit 94 issues an alarm. Then, the user can recognize the defect of the power detector 6. Further, when the adjusting amount becomes smaller than the second lower limit threshold $S2_{min}$, the operation of the high frequency power supply device 1 is stopped.

Since the power outputted from the amplifier 2 decreases as the adjusting amount decreases, the current value of the driving current also decreases. In the high frequency power supply device 1 according to the embodiment of the present disclosure, when the current value is monitored, whether or not the current value is greater than equal to the lower limit threshold of the current value corresponding to the target power value P is also monitored. Accordingly, the defect of the power detector 6 can also be detected.

Figure 5:
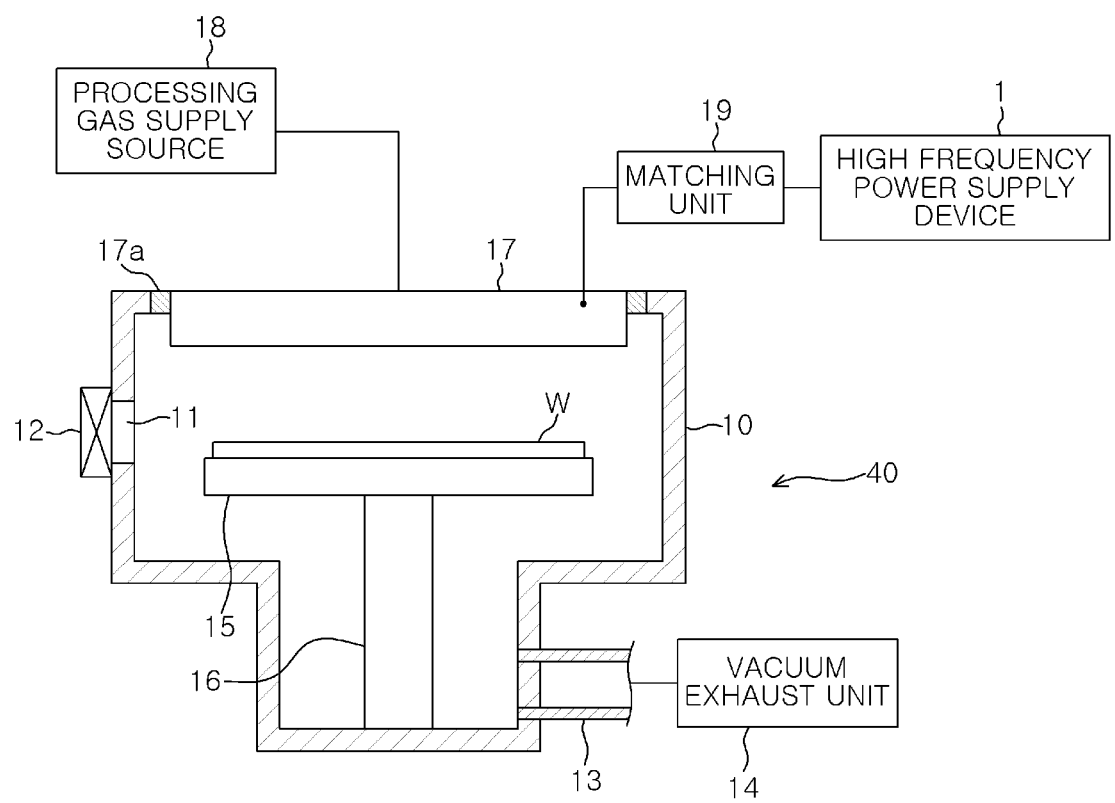
FIG. 5 is a cross-sectional view of a plasma processing apparatus including the high frequency power supply device.

The above-described high frequency power supply device 1 of the present embodiment can be applied to, e.g., a plasma processing apparatus for performing plasma treatment on a semiconductor wafer (hereinafter, referred to as "wafer") serving as a substrate. As shown in FIG. 5, the plasma processing apparatus 40 includes a processing chamber 10, and a mounting table 15 for substantially horizontally mounting thereon the wafer W is disposed in the processing chamber 10 through a supporting column 16. A reference numeral '11' denotes a loading/unloading port for the wafer W that is formed at a side surface of the processing chamber 10. A reference numeral '12' denotes a gate valve. A vacuum exhaust unit 14 is connected to the processing chamber 10 through a gas exhaust line 13.

A metal shower head 17 for supplying a processing gas for substrate processing toward the wafer W is disposed at a ceiling surface of the processing chamber 10 through an insulating member 17a. The shower head 17 is configured to supply the processing gas from a processing gas supply source 18 into the processing chamber 10. The high frequency power supply device 1 is connected to the shower head 17 through a matching unit 19. Therefore, the shower head 17 in this example corresponds to the load 4 shown in FIG. 1.

In the plasma processing apparatus 40, the processing gas is supplied into the processing chamber 10 in a vacuum atmosphere and the high frequency power is supplied to the shower head 17 to generate a high frequency electric field in the processing chamber 10. Accordingly, plasma of the processing gas is generated and the wafer W is processed by the plasma thus generated. However, if the wafer W is processed without recognizing the deterioration of the high frequency power supply device 1, e.g., the deterioration of the amplifier 2, the amplifier 2 may experience the malfunction during the processing of the wafer W. If the malfunction of the amplifier 2 occurs during the processing of the wafer W, the high frequency electric field cannot be generated in the processing chamber 10 and the conversion of the processing gas to the plasma becomes insufficient. Accordingly, the processing of the wafer W becomes insufficient, thereby causing the defect of the wafer W.

By applying the high frequency power supply device 1 according to the embodiment of the present disclosure to the plasma processing apparatus 40, the deterioration of the amplifier 2 can be detected before the malfunction of the amplifier 2. Therefore, it is possible to suppress the generation of defective products due to the malfunction of the amplifier 2 during the processing of the wafer W. In addition, since the alternative high frequency power supply device 1 can be prepared or the product processing can be intentionally stopped before the malfunction of the amplifier 2, unnecessary downtime caused by the malfunction during the processing of the wafer W can be reduced.

The load 4 is not limited to the shower head 17 and may be an electrode disposed at the mounting table 15. The electrode to which the high frequency power is supplied is used for attracting ions in the plasma to the wafer W on the mounting table 15.

In the above-described embodiment, the amplification degree of the amplifier 2 is controlled such that the high frequency power outputted from the high frequency power supply device 1 for amplifying a high frequency and supplying a high frequency power to the load 4 becomes a set target power value P. The adjusting amount of the amplification degree is monitored, and the alarm unit 94 issues an alarm when the adjusting amount is not in a range between the upper limit threshold and the lower limit threshold of the preset adjusting amount set to correspond to the target power value P. Further, the current value of the current for driving the amplifier 2 is monitored, and the alarm unit 94 issues an alarm when the current value is not in a range between the upper limit threshold and the lower limit threshold of the preset current value set to correspond to the target power value P. Accordingly, the deterioration of the amplifier 2 can be detected.

With the configuration including one of the adjusting amount abnormality detector 93B for detecting the abnormality by monitoring the adjusting amount and the current abnormality detector 93C for detecting the abnormality by detecting the current value of the amplifier 2, it is possible to detect the deterioration of the amplifier 2. However, the configuration including both of the adjusting amount abnormality detector 93B and the current abnormality detector 93C can further increase the accuracy in detecting the occurrence of the abnormality of the amplifier 2.

The parameter detector may be a voltage detector for detecting a high frequency voltage outputted from the amplifier 2 or a current detector for detecting a high frequency current outputted from the amplifier 2. The adjusting amount may be determined based on the detected current or the detected voltage, and the parameter detector may be configured to detect the occurrence of the abnormality based on the determined adjusting amount. When detecting the current, the detected current may be converted to a voltage to calculate the measured value, in the same manner as the case of detecting the power as described above. However, it is preferable to detect the power in order to improve accuracy.

When the amplifier 2 is in a normal state, the range between the upper limit threshold and the lower limit threshold of the adjusting amount inputted to the amplifier 2 varies depending on the target power value P. Further, when the amplifier 2 is in a normal state, the range between the upper limit threshold and the lower limit threshold of the current value of the driving current for driving the amplifier 2 varies depending on the target power value P.

For example, in the plasma processing apparatus, the processing time and the required target value P of the high frequency power may vary depending on recipes performed on the wafer W. Therefore, the appropriate range between the upper and the lower limit threshold of the adjusting amount and the appropriate range between the upper and the lower limit threshold of the current value of the driving current vary depending on the recipes. Accordingly, it is preferable to set, for each target power value P, the range between the upper and the lower limit threshold of the adjusting amount and the range between the upper and the lower limit threshold of the current value of the driving current.

Alternatively, for example, the range between the upper and the lower limit threshold of the adjusting amount and the range between the upper and the lower limit threshold of the current value of the driving current may be set for each recipe.

In the above-described Japanese Patent Application Publication No. 2018-143368, the deterioration state of the vacuum tube is detected based on the current supplied to the vacuum tube, whereas there is no process of detecting the occurrence of the abnormality by setting the upper and the lower limit threshold of the supplied current and comparing the supplied current with the upper and the lower limit threshold.

Figure 6:
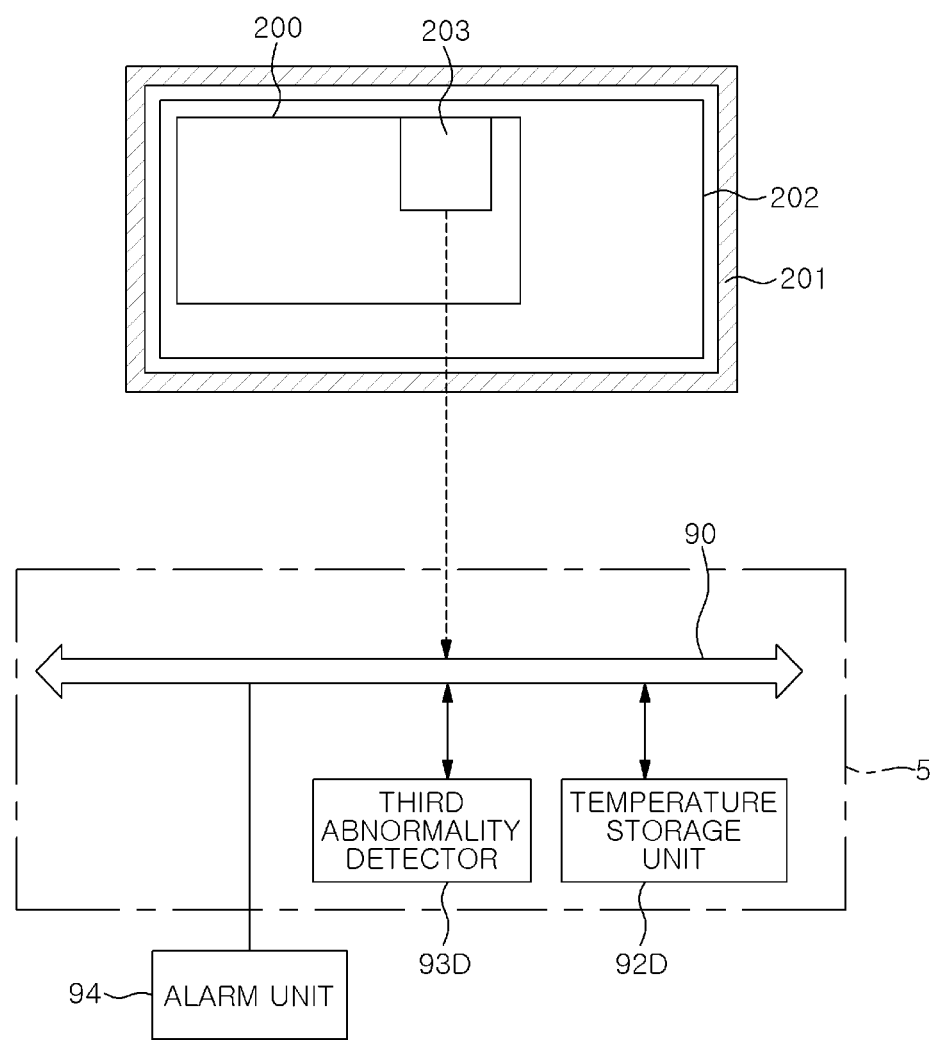
FIG. 6 shows a configuration of a high frequency power supply device according to another embodiment of the present disclosure.

Further, the occurrence of the abnormality in the amplifier 2 may be detected based on changes in the temperature of the amplifier 2. The power detector 6, the controller 5, the amplifying device 3, a voltage supply source 33, the high frequency oscillator 20, and the amplifier 2 are disposed in a housing 201. As shown in FIG. 6, the circuit constituting the amplifier 2 is included in, e.g., an integrated circuit chip 200. The chip 200 is mounted on a circuit board 202 disposed in the housing 201. A temperature sensor 203 is disposed on the surface of the chip 200, so that the controller 5 can obtain the temperature detected by the temperature sensor 203.

Figure 7:
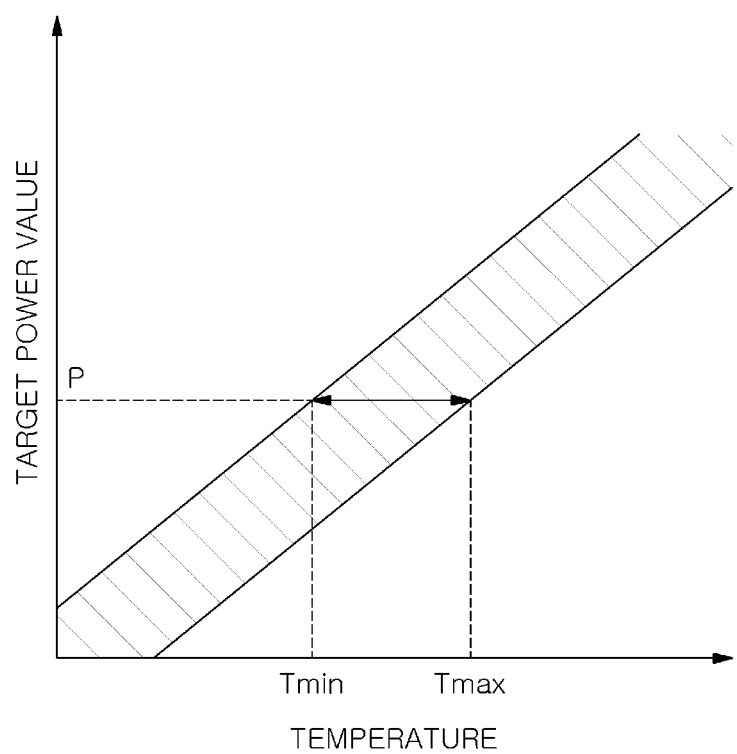
FIG. 7 is a graph showing an upper limit value and a lower limit value of a temperature corresponding to a target power value.

In this example, the controller 5 includes, e.g., a temperature storage unit 92D storing an upper limit threshold and a lower limit threshold of the temperature detected by the temperature sensor 203 corresponding to the target power value P, and a third abnormality detector 93D for comparing the temperature detected by the temperature sensor 203 with the upper limit threshold and the lower limit threshold of the detected temperature corresponding to the target power value P. The controller 5 shown in FIG. 6 includes the temperature storage unit 92D and the third abnormality detector 93D in addition to the configuration of the controller 5 shown in FIG. 2 that is not shown in FIG. 6. FIG. 7 is a graph schematically showing a relational expression stored in the temperature storage unit 92D. As described above, the temperature storage unit 92D stores an upper limit temperature threshold $T_{max}$ and a lower limit threshold $T_{min}$ set for each target power value P.

For example, when the resistance of the circuit constituting the amplifier 2 increases due to the deterioration of the amplifier 2, the heat generation increases and, thus, the detected temperature increases. Therefore, the temperature at which the deterioration of the amplifier 2 can be determined is stored as the upper limit threshold of the temperature for each target power value P. Further, the lower limit threshold of the range of the temperature detected when the amplifier 2 is functioning normally is stored as the lower limit threshold of the temperature corresponding to the target power value P.

The third abnormality detector 93D causes the alarm unit 94 to issue an alarm when the temperature of the chip 200 exceeds the upper limit threshold of the temperature set to correspond to the target power value P. With this configuration, the deterioration of the amplifier can also be detected from the heat generated by the amplifier 2. Accordingly, the deterioration of the amplifier 2 can be detected more reliably. In addition, the detected temperature may become lower than the lower limit threshold due to the defect of the temperature sensor 203. In this case, the defect of the temperature sensor 203 can be estimated.

Similar to the range of the adjusting amount, it is possible to set a first upper limit threshold, a second upper limit threshold, a first lower limit threshold, and a second lower limit threshold of the range of the temperature detected by the temperature sensor 203. Then, the alarm output and the operation stop of the high frequency power supply device can be separately performed based on the comparison result between the detected temperature and the thresholds. It is preferable to provide the temperature sensor 203 on the chip 200 because the changes in the operation state of the amplifier 2 can be accurately detected from the changes in the temperature as described above. However, as long as the temperature sensor 203 can detect the temperature corresponding to the temperature of the chip 200 constituting the amplifier 2, the temperature sensor 203 may be disposed distant from the chip 200 in the housing 201.

When the adjusting amount abnormality detector 93B is used to detect the occurrence of the abnormality by monitoring the adjusting amount, it is not necessary to compare the adjusting amount with the upper limit threshold and the lower limit threshold of the adjusting amount corresponding to the power target value P. For example, it is also possible to measure the change rate of the adjusting amount per unit time and determine the deterioration of the amplifier 2 when the change rate of the adjusting amount exceeds a predetermined threshold.

In addition, the above-described control of monitoring the measured change rate of the adjusting amount per unit time may be combined with the conventional control of monitoring the measured power value and causing the alarm unit 94 to issue an alarm or stopping the operation of the device when the measured power value becomes smaller than a predetermined threshold.

Further, the D/A converter 31 of the amplifying device 3 may be included in the controller 5. The amplifier 2 and the amplifying device 3 may be integrated, or each of them may be divided into two or more parts. In that case, the deterioration of each amplifier 2 and each amplifying device 3 may be detected in the above-described manner.

In this configuration, for the respective amplifiers 2 and the respective amplifying devices 3, the measured current value or the measured adjusting amount that indicates the deterioration state of the respective amplifiers 2 and the respective amplifying devices 3 may be respectively added up and used for determining the abnormality based on the added current values or the added adjusting amounts.

In the above example, the amplification degree of the amplifier 2 is increased or decreased by increasing or decreasing a level of a gate signal while fixing a source voltage of a DC voltage (field effect transistor (FET)). However, the amplification degree of the amplifier 2 may be increased or decreased by increasing or decreasing the source voltage while fixing the level of the gate signal.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A high frequency power supply device comprising:
an amplifier configured to amplify a high frequency supplied from an oscillator and supply a high frequency power therefrom to a load;
a parameter detector configured to detect a parameter of a current, a voltage, or a power supplied from the amplifier to the load;
a current supply unit configured to supply a driving current for driving the amplifier; and
a command signal output unit configured to output a command signal for changing an amplification degree of the amplifier based on the detected parameter and a target value such that the parameter becomes the target value,
wherein the high frequency power supply device further comprises a first abnormality detector configured to detect an abnormality by monitoring the command signal, and/or the high frequency power supply device further comprises a current detector configured to detect the driving current, a current data storage unit configured to store an upper limit value and a lower limit value of the driving current, and a second abnormality detector configured to detect the abnormality based on at least one of the upper limit value or the lower limit value of the driving current.

2. The high frequency power supply device of claim 1, wherein the high frequency power supply device comprises both of the first abnormality detector and the second abnormality detector.

3. The high frequency power supply device of claim 1, wherein the amplifier includes a front-stage amplifier and a rear-stage amplifier,
an amplification degree of the front-stage amplifier is changed by the command signal, and
the current detector detects a driving current supplied to the rear-stage amplifier.

4. The high frequency power supply device of claim 2, wherein the amplifier includes a front-stage amplifier and a rear-stage amplifier,
an amplification degree of the front-stage amplifier is changed by the command signal, and
the current detector detects a driving current supplied to the rear-stage amplifier.

5. The high frequency power supply device of claim 1, wherein the first abnormality detector detects the abnormality when the command signal corresponding to the amplification degree, which exceeds an upper limit value of a preset amplification degree set based on the target value, is outputted.

6. The high frequency power supply device of claim 2, wherein the first abnormality detector detects the abnormality when the command signal corresponding to the amplification degree, which exceeds an upper limit value of a preset amplification degree set based on the target value, is outputted.

7. The high frequency power supply device of claim 3, wherein the first abnormality detector detects the abnormality when the command signal corresponding to the amplification degree, which exceeds an upper limit value of a preset amplification degree set based on the target value, is outputted.

8. The high frequency power supply device of claim 5, wherein at least one of the upper and the lower limit value of the driving current or the upper limit value of the preset amplification degree is set for each target value for the power supplied.

9. The high frequency power supply device of claim 6, wherein at least one of the upper and the lower limit value of the driving current or the upper limit value of the preset amplification degree is set for each target value for the power supplied.

10. The high frequency power supply device of claim 7, wherein at least one of the upper and the lower limit value of the driving current or the upper limit value of the preset amplification degree is set for each target value for the power supplied.

11. A high frequency power supply device of claim 1, further comprising:
a housing that stores the amplifier;
a temperature sensor configured to detect a temperature in the housing;
a third abnormality detector configured to detect the abnormality based on the detected temperature.

12. A high frequency power supply device of claim 2, further comprising:
a housing that stores the amplifier;

a temperature sensor configured to detect a temperature in the housing;

a third abnormality detector configured to detect the abnormality based on the detected temperature.

13. A high frequency power supply device of claim 3, further comprising:

a housing that stores the amplifier;

a temperature sensor configured to detect a temperature in the housing;

a third abnormality detector configured to detect the abnormality based on the detected temperature.

14. A high frequency power supply device of claim 5, further comprising:

a housing that stores the amplifier;

a temperature sensor configured to detect a temperature in the housing;

a third abnormality detector configured to detect the abnormality based on the detected temperature.

15. A high frequency power supply device of claim 8, further comprising:

a housing that stores the amplifier;

a temperature sensor configured to detect a temperature in the housing;

a third abnormality detector configured to detect the abnormality based on the detected temperature.

16. The high frequency power supply device of claim 11, wherein the amplifier is included in a chip of an integrated circuit mounted on a circuit board, and the temperature sensor is disposed on a surface of the chip.

17. The high frequency power supply device of claim 1, wherein the load is provided in a processing chamber where a semiconductor substrate is stored and processed.

18. A high frequency power supply method comprising:

amplifying a high frequency supplied from an oscillator using an amplifier and supplying amplified high frequency power therefrom to a load;

detecting a parameter of a current, a voltage or a power supplied from the amplifier to the load;

outputting a command signal for changing an amplification degree of the amplifier based on the detected parameter and a target value such that the parameter becomes the target value; and detecting a driving current for driving the amplifier and detecting an abnormality based on an upper limit value and a lower limit value of the driving current stored in advance in a current data storage unit.

\* \* \* \* \*